(12) United States Patent
Cheng

(10) Patent No.: US 12,094,958 B2
(45) Date of Patent: Sep. 17, 2024

(54) SEMICONDUCTOR STRUCTURES AND MANUFACTURING METHODS THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 394 days.

(21) Appl. No.: 17/622,974

(22) PCT Filed: Dec. 5, 2019

(86) PCT No.: PCT/CN2019/123310
§ 371 (c)(1),
(2) Date: Dec. 27, 2021

(87) PCT Pub. No.: WO2021/109075
PCT Pub. Date: Jun. 10, 2021

(65) Prior Publication Data
US 2022/0262933 A1    Aug. 18, 2022

(51) Int. Cl.
*H01L 29/732* (2006.01)
*H01L 21/02* (2006.01)
(Continued)

(52) U.S. Cl.
CPC ...... *H01L 29/7325* (2013.01); *H01L 21/0254* (2013.01); *H01L 21/0262* (2013.01); *H01L 29/2003* (2013.01); *H01L 29/6631* (2013.01)

(58) Field of Classification Search
None
See application file for complete search history.

(56) References Cited

U.S. PATENT DOCUMENTS

| 6,245,687 B1 | 6/2001 | Barsky et al. |
| 7,875,534 B2 | 1/2011 | Yu et al. |

(Continued)

FOREIGN PATENT DOCUMENTS

| CN | 1363730 A | 8/2002 |
| CN | 101635255 A | 1/2010 |

(Continued)

OTHER PUBLICATIONS

State Intellectual Property Office of the People's Republic of China, Office Action and Search Report Issued in Application No. 2019801024983, Dec. 28, 2022, 12 pages. (Submitted with Machine/Partial Translation).

(Continued)

*Primary Examiner* — Khaja Ahmad
(74) *Attorney, Agent, or Firm* — The Small Patent Law Group LLC; Christopher R. Carroll

(57) ABSTRACT

The present disclosure provides a semiconductor structure and a manufacturing method thereof. In the manufacturing method, a first P-type semiconductor layer is provided, and an N-type semiconductor layer and a second P-type semiconductor layer are formed in sequence on the first P-type semiconductor layer. The first P-type semiconductor layer, the N-type semiconductor layer and the second P-type semiconductor layer all include a GaN-based material. When the first P-type semiconductor layer is provided, its upper surface is controlled to be a Ga surface; when the N-type semiconductor layer is formed, its upper surface is controlled to be an N surface; when the second P-type semiconductor layer is formed, its upper surface is controlled to be an N surface.

20 Claims, 6 Drawing Sheets

(51) Int. Cl.
*H01L 29/20* (2006.01)
*H01L 29/66* (2006.01)

(56) References Cited

U.S. PATENT DOCUMENTS

| | | | |
|---|---|---|---|
| 8,486,807 | B2 | 7/2013 | Yu et al. |
| 9,099,610 | B2 | 8/2015 | Moon |
| 10,056,477 | B1* | 8/2018 | Choi .................... H01L 29/0821 |
| 2001/0032999 | A1 | 10/2001 | Yoshida |
| 2004/0079964 | A1* | 4/2004 | Hori .................... H01L 21/0262 |
| | | | 257/E21.387 |
| 2007/0232008 | A1* | 10/2007 | Nakazawa ........ H01L 29/66318 |
| | | | 257/E29.189 |
| 2010/0015787 | A1 | 1/2010 | Yu et al. |
| 2011/0189837 | A1 | 8/2011 | Yu et al. |
| 2013/0285095 | A1 | 10/2013 | Moon |
| 2014/0117376 | A1 | 5/2014 | Terano et al. |
| 2016/0268134 | A1* | 9/2016 | Isobe ................ H01L 29/41708 |
| 2018/0012979 | A1* | 1/2018 | Umemoto ........... H01L 29/7371 |
| 2019/0103507 | A1* | 4/2019 | Henley ............. H01L 21/02002 |
| 2021/0057560 | A1* | 2/2021 | Cheng ................. H01L 29/1066 |

FOREIGN PATENT DOCUMENTS

| | | |
|---|---|---|
| CN | 103378240 A | 10/2013 |
| CN | 108023001 A | 5/2018 |
| CN | 109844958 A | 6/2019 |
| CN | 110504330 A | 11/2019 |
| JP | 2010087376 A | 4/2010 |
| TW | 200939536 A | 9/2009 |
| TW | 201813088 A | 4/2018 |

OTHER PUBLICATIONS

TW Patent Office, Office Action Issued in Application No. 109142503, Nov. 8, 2022, 34 pages.(Submitted with Machine/Partial Translation).
ISA State Intellectual Property Office of the People's Republic of China, International Search Report Issued in Application No. PCT/CN2019/123310, Sep. 8, 2020, WIPO, 4 pages.
ISA State Intellectual Property Office of the People's Republic of China, Written Opinion of the International Searching Authority Issued in Application No. PCT/CN2019/123310, Sep. 8, 2020, WIPO, 6 pages. (Submitted with Machine/Partial Translation).
TW Patent Office, Office Action Issued in Application No. 109142503, Jul. 28, 2021, 6 pages. (Submitted with Machine/ Partial Translation).
TW Patent Office, Decision of Rejection Issued in Application No. 109142503, Oct. 29, 2021, 7 pages.(Submitted with Machine/Partial Translation).

* cited by examiner

SEMICONDUCTOR STRUCTURES AND MANUFACTURING METHODS THEREOF

This application is a national stage entry of International Patent Application No. PCT/CN2019/123310 (filed 5 Dec. 2019), the entire disclosure of which is incorporated herein by reference.

TECHNICAL FIELD

The present disclosure relates to the field of semiconductor technologies, and in particular to a semiconductor structure and a manufacturing method thereof.

BACKGROUND

III-nitride is a third generation novel semiconductor material subsequent to the first and second generation semiconductor materials such as Si, GaAs, etc. GaN, as a wide forbidden band semiconductor material, has many advantages such as high saturation drift velocity, great breakdown voltage and excellent carrier transport performance, and can form tertiary alloys of AlGaN and InGaN and quaternary alloy of AlInGaN and the like and can be easily made into GaN-based PN junctions. In view of this, the GaN-based materials and the semiconductor devices are extensively and deeply studied in recent years. The GaN-based materials grown based on MOCVD (Metal-Organic Chemical Vapour Deposition) technology have become more and more mature. In the researches of semiconductor devices, the researches in the photo-electronic devices such as GaN-based light-emitting diodes, GaN-based laser diodes, etc., and in the microelectronic devices such as GaN-based High Electron Mobility Transistors, etc., have gained significant progress and considerable development.

At present, there are still aspects of GaN-based semiconductor devices that need to be improved. One of technical problems is that over-etching occurs during manufacturing of contact electrodes on a P-type GaN-based semiconductor layer and/or N-type GaN-based semiconductor layer.

In view of this, it is necessary to provide a new semiconductor structure and a manufacturing method thereof to solve the above technical problems.

SUMMARY

The present disclosure aims to provide a semiconductor structure and a manufacturing method thereof to improve performances of GaN-based semiconductor devices.

In order to achieve the above object, a first aspect of the present disclosure provides a manufacturing method of a semiconductor structure. The manufacturing method includes:

providing a first P-type semiconductor layer, where the first P-type semiconductor layer includes a GaN-based material, and an upper surface of the first P-type semiconductor layer is a Ga surface;

forming an N-type semiconductor layer on the first P-type semiconductor layer, where the N-type semiconductor layer includes a GaN-based material, and an upper surface of the N-type semiconductor layer is an N surface;

forming a second P-type semiconductor layer on the N-type semiconductor layer, where the second P-type semiconductor layer includes a GaN-based material, and an upper surface of the second P-type semiconductor layer is an N surface;

removing the second P-type semiconductor layer in a collector electrode region and the N-type semiconductor layer in the collector electrode region by wet etching to expose a part of the first P-type semiconductor layer; and removing the second P-type semiconductor layer in a base electrode region by dry etching to expose a part of the N-type semiconductor layer.

GaN crystal is a wurtzite structure, where Ga and N atom layers are presented like ABABAB hexagonal stacking, and each Ga(N) atom is bonded with its surrounding four N(Ga) atoms like diamond-like tetrahedral structure. It is noted that with a Ga—N bond parallel to C axis ([0001] crystal orientation) as reference, if a Ga atom in each Ga—N bond is farther from a substrate, the upper surface is a Ga surface; if an N atom in each Ga—N bond is farther from the substrate, the upper surface is an N surface.

Optionally, before the N-type semiconductor layer is formed on the first P-type semiconductor layer, a P-type doped ion in the first P-type semiconductor layer is activated.

Optionally, a collector electrode is formed on the first P-type semiconductor layer of the collector electrode region, a base electrode is formed on the N-type semiconductor layer of the base electrode region, and an emitter electrode is formed on the second P-type semiconductor layer of an emitter electrode region.

Optionally, the N-type semiconductor layer with the upper surface as N surface is formed on the first P-type semiconductor layer by directly bonding a Ga surface of the N-type semiconductor layer with the Ga surface of the first P-type semiconductor layer.

Optionally, the N-type semiconductor layer with the upper surface as N surface is formed on the first P-type semiconductor layer by enabling the N surface of the N-type semiconductor layer to face upward through polarity inversion in a process of forming the N-type semiconductor layer.

Optionally, the second P-type semiconductor layer with the upper surface as N surface is formed on the N-type semiconductor layer by directly bonding a Ga surface of the second P-type semiconductor layer with the N surface of the N-type semiconductor layer.

Optionally, the second P-type semiconductor layer with the upper surface as N surface is formed on the N-type semiconductor layer by enabling the N surface of the second P-type semiconductor layer to face upward through polarity inversion in a process of forming the second P-type semiconductor layer.

Optionally, the GaN-based material includes at least one of GaN, AlGaN, InGaN or AlInGaN.

A second aspect of the present disclosure provides a manufacturing method of a semiconductor structure. The manufacturing method includes:

providing an N-type semiconductor layer, where the N-type semiconductor layer includes a GaN-based material, and an upper surface of the N-type semiconductor layer is a Ga surface;

forming a second P-type semiconductor layer on the N-type semiconductor layer, where the second P-type semiconductor layer includes a GaN-based material, and an upper surface of the second P-type semiconductor layer is an N surface; and removing a part of the second P-type semiconductor layer by wet etching to expose a part of the N-type semiconductor layer.

Optionally, the second P-type semiconductor layer with the upper surface as N surface is formed on the N-type semiconductor layer by directly bonding a Ga surface of the second P-type semiconductor layer with the Ga surface of the N-type semiconductor layer.

Optionally, the second P-type semiconductor layer with the upper surface as N surface is formed on the N-type semiconductor layer by enabling the N surface of the second P-type semiconductor layer to face upward through polarity inversion in a process of forming the second P-type semiconductor layer.

A third aspect of the present disclosure provides a semiconductor structure. The semiconductor structure includes:

a first P-type semiconductor layer, an N-type semiconductor layer and a second P-type semiconductor layer distributed from bottom to top, where:

the first P-type semiconductor layer includes a GaN-based material, and an upper surface of the first P-type semiconductor layer is a Ga surface; the N-type semiconductor layer includes a GaN-based material, and an upper surface of the N-type semiconductor layer is an N surface; the second P-type semiconductor layer includes a GaN-based material, and an upper surface of the second P-type semiconductor layer is an N surface; and a part of the Ga surface of the first P-type semiconductor layer and a part of the N surface of the N-type semiconductor layer are exposed.

Optionally, the semiconductor structure further includes a collector electrode on the exposed first P-type semiconductor layer, a base electrode on the exposed N-type semiconductor layer and an emitter electrode (E) on the second P-type semiconductor layer.

A fourth aspect of the present disclosure provides a semiconductor structure. The semiconductor structure includes:

an N-type semiconductor layer and a second P-type semiconductor layer distributed from bottom to top, where:

the N-type semiconductor layer includes a GaN-based material, and an upper surface of the N-type semiconductor layer is a Ga surface; the second P-type semiconductor layer includes a GaN-based material, and an upper surface of the second P-type semiconductor layer is an N surface; and a part of the Ga surface of the N-type semiconductor layer is exposed.

Compared with the prior art, the present disclosure has the following beneficial effects.

1) In the manufacturing method of a semiconductor structure of the present disclosure, a first P-type semiconductor layer is firstly provided, where the first P-type semiconductor layer includes a GaN-based material; then, an N-type semiconductor layer is formed on the first P-type semiconductor layer, where the N-type semiconductor layer includes a GaN-based material; then, a second P-type semiconductor layer is formed on the N-type semiconductor layer, where the second P-type semiconductor layer includes a GaN-based material. When the first P-type semiconductor layer is provided, its upper surface is controlled to be a Ga surface; when the N-type semiconductor layer is formed, its upper surface is controlled to be an N surface; when the second P-type semiconductor layer is formed, its upper surface is controlled to be an N surface. By use of the directivity of wet etching, etching is started from the N surface of the second P-type semiconductor layer and automatically stopped on the Ga surface of the first P-type semiconductor layer, thereby avoiding over-etching. If dry etching is adopted, when the dry etching is stopped, the first P-type semiconductor layer will be over-etched. In a dry etching process, nitrogen atoms in the GaN-based material will preferentially escape, leading to a larger number of electron carriers. For the P-type semiconductor layer, some of the hole carriers will be neutralized, leading to a decreased hole carrier concentration and even to surface inversion. Therefore, compared with the dry etching, the wet etching can avoid the above problems in the process of forming an electrical connection structure of the P-type semiconductor layer. Afterwards, dry etching is performed on the second P-type semiconductor layer and stopped on the upper surface of the N-type semiconductor layer. When the dry etching is stopped, the N-type semiconductor layer will be over-etched, nitrogen atoms in the GaN-based material preferentially escape, leading to a larger number of electron carriers. For the N-type semiconductor layer, a resistivity of the surface will be reduced, helping to reduce a contact resistance of an electrical connection structure of the N-type semiconductor layer.

2) In an optional solution, before the N-type semiconductor layer is formed on the first P-type semiconductor layer, P-type doped ions in the first P-type semiconductor layer are activated. The solution can provide an escape path for released H atoms to increase the quality of the PNP bipolar transistor. The reason is that: when the P-type GaN-based material is grown based on MOCVD technology, a large number of H atoms are present in the MOCVD growth environment. If these H atoms are not removed, an acceptor dopant Mg in GaN will be passivated by the large number of H atoms and thus will not produce holes. Furthermore, a large number of passivated and un-bonded Mg ions will enter the N-type GaN-based material layer grown above. In this case, the junction surface of the PN junction will be blurred and a part of the N-type GaN-based material layer is compensated, resulting in a reduced electron concentration and even failure of the PN junction.

3) In an optional solution, the N-type semiconductor layer with the upper surface as N surface is formed on the first P-type semiconductor layer by: a) directly bonding a Ga surface of the N-type semiconductor layer with the Ga surface of the first P-type semiconductor layer; or b) enabling the N surface of the N-type semiconductor layer to face upward through polarity inversion in a process of forming the N-type semiconductor layer. In an optional solution, the second P-type semiconductor layer with the upper surface as N surface is formed on the N-type semiconductor layer by: a) directly bonding a Ga surface of the second P-type semiconductor layer with the N surface of the N-type semiconductor layer; or b) by enabling the N surface of the second P-type semiconductor layer to face upward through polarity inversion in a process of forming the second P-type semiconductor layer. Research shows that the above two processes are both reliable.

Figure 1:
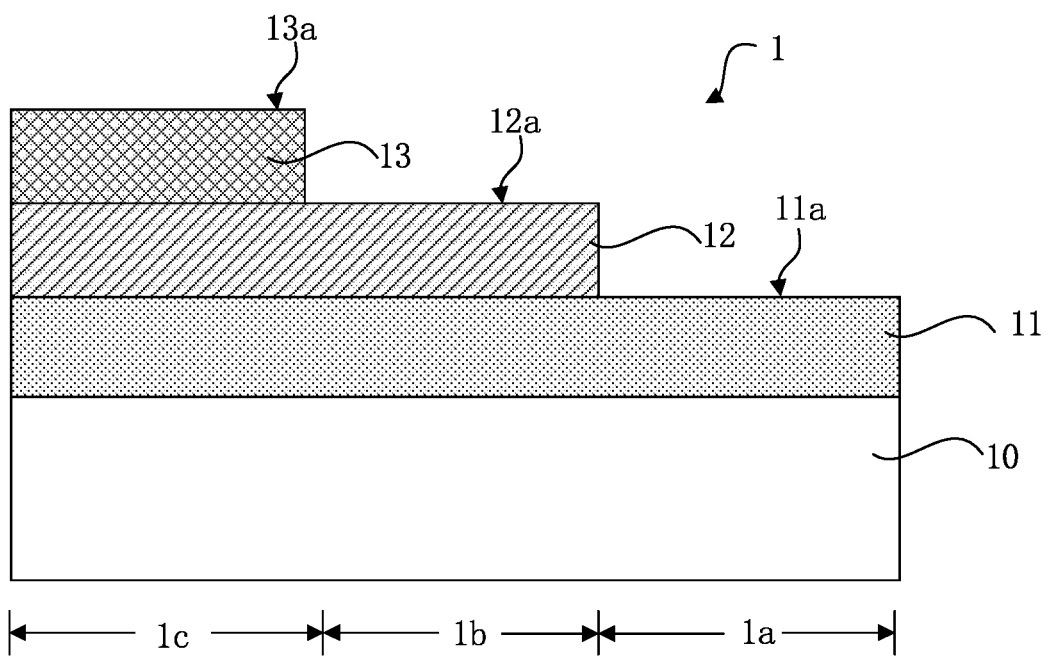
FIG. 1 is a structural schematic diagram illustrating a semiconductor structure according to a first embodiment of the present disclosure.

To help understand the present disclosure, all reference numerals appearing the present disclosure are listed below.

Semiconductor structure 1, 2, 3, and 4,
Semiconductor substrate 10
First P-type semiconductor layer 11
Upper surface 11a of the first P-type semiconductor layer
N-type semiconductor layer 12
Upper surface 12a of the N-type semiconductor layer
Second P-type semiconductor layer 13
Upper surface 12a of the second P-type semiconductor layer
Collector electrode region 1a
Base electrode region 1b
Emitter electrode region 1c
Collector electrode C
Base electrode B
Emitter electrode E

DETAILED DESCRIPTION OF THE EMBODIMENTS

In order to make the object, features and advantages of the present disclosure clearer and more understandable, the specific embodiments of the present disclosure will be detailed below in combination with the accompanying drawings.

FIG. 1 is a structural schematic diagram illustrating a semiconductor structure according to a first embodiment of the present disclosure.

With reference to FIG. 1, the semiconductor structure 1 of the first embodiment includes:

a semiconductor substrate 10, a first P-type semiconductor layer 11, an N-type semiconductor layer 12 and a second P-type semiconductor layer 13 from bottom to top.

The first P-type semiconductor layer 11 includes a GaN-based material, and an upper surface 11a of the first P-type semiconductor layer 11 is a Gallium (also abbreviated to as Ga) surface. The N-type semiconductor layer 12 includes a GaN-based material, and an upper surface 12a of the N-type semiconductor layer 12 is a Nitrogen (also abbreviated to as N) surface. The second P-type semiconductor layer 13 includes a GaN-based material, and an upper surface 13a of the second P-type semiconductor layer 13 is an N surface. A part of the Ga surface of the first P-type semiconductor layer 11 and a part of the N surface of the N-type semiconductor layer 12 are exposed.

The above semiconductor structure 1 may be a PNP bipolar transistor.

The semiconductor substrate 10 may be made of sapphire, silicon carbide, silicon, GaN or diamond or the like, which is not limited in the embodiment. The GaN-based material may include at least one of GaN, AlGaN, InGaN or AlInGaN, which is not limited in this embodiment.

The upper surface 11a of the first P-type semiconductor layer 11 is a Ga surface, which means that with a Ga—N bond parallel to C axis ([0001] crystal orientation) as reference, Ga atom in each Ga—N bond is farther from the semiconductor substrate 10. It is understood that, at this time, a lower surface of the first P-type semiconductor layer 11 is an N surface.

The upper surface 12a of the N-type semiconductor layer 12 and the upper surface 13a of the second P-type semi- conductor layer 13 are N surfaces, which means that with a Ga—N bond parallel to C axis ([0001] crystal orientation) as reference, N atom in each Ga—N bond is farther from the semiconductor substrate 10. It is understood that at this time, lower surfaces of the N-type semiconductor layer 12 and the second P-type semiconductor layer 13 are Ga surfaces.

The exposed region of the upper surface 11a of the first P-type semiconductor layer 11, the exposed region of the upper surface 12a of the N-type semiconductor layer 12 and the upper surface 13a of the second P-type semiconductor layer 13 may form an electrical connection structure, for example, a metal interconnection structure, so as to lead out electrical signals of the first P-type semiconductor layer 11, the N-type semiconductor 12 and the second P-type semiconductor layer 13 respectively.

Figure 2:
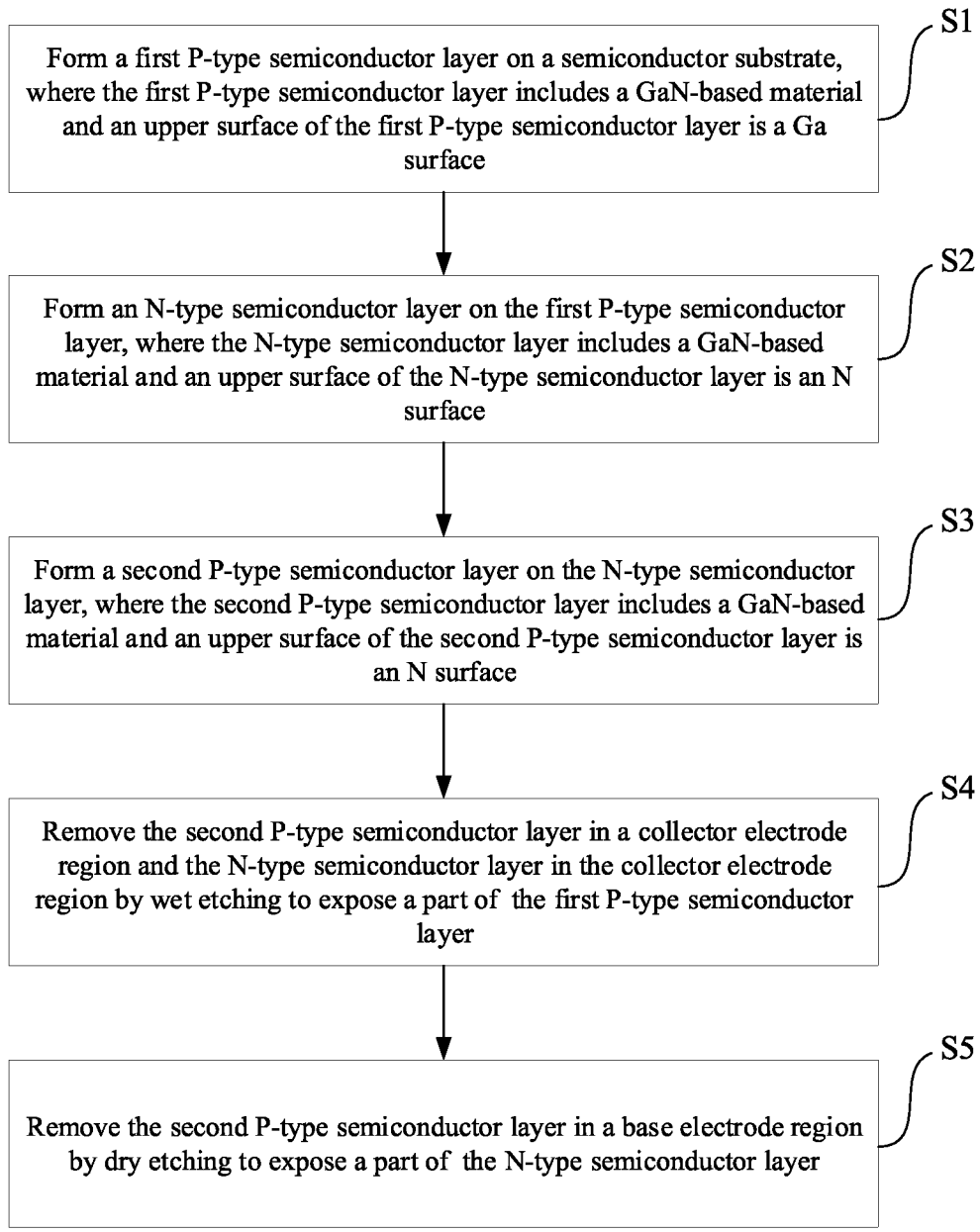
FIG. 2 is a flowchart illustrating a manufacturing method of the semiconductor structure shown in FIG. 1.

For the semiconductor structure 1 shown in FIG. 1, an embodiment of the present disclosure provides a corresponding manufacturing method. FIG. 2 illustrates a flowchart of the manufacturing method.

Firstly, at step S1, with reference to FIGS. 1 and 2, a first P-type semiconductor layer 11 is formed on a semiconductor substrate 10, where the first P-type semiconductor layer 11 includes a GaN-based material and an upper surface 11a of the first P-type semiconductor layer 11 is a Ga surface.

The semiconductor substrate 10 may be made of sapphire, silicon carbide, silicon, GaN or diamond or the like, which is not limited in the embodiment.

The GaN-based material of the first P-type semiconductor layer 11 may include at least one of GaN, AlGaN, InGaN or AlInGaN, which is not limited in this embodiment.

The material of the first P-type semiconductor layer 11, for example, GaN, may be grown based on MOCVD technology. Illustratively, $NH_3$ and TMGa are an N source and a Ga source respectively and $H_2$ is a carrier gas. Specifically, P-type ions may be doped while GaN is grown. The P-type ions may be Mg, a source of which may be CP2Mg. In other optional solutions, the P-type doped ions may include at least one of calcium, carbon, beryllium, yttrium or zinc.

In an optional solution, a buffer layer may be grown firstly on the semiconductor substrate 10, and then the first P-type semiconductor layer 11 is grown on the buffer layer. The disposal of the buffer layer may reduce a threading dislocation (TD) density in the first P-type semiconductor layer 11 and TD bending resulting from a lateral growth mechanism.

In an optional solution, the upper surface 11a of the first P-type semiconductor layer 11 may be controlled to be a Ga surface by enabling the Ga surface of the first P-type semiconductor layer 11 to face upward through epitaxial growth in a process of forming the first P-type semiconductor layer 11.

Next, at step S2, still referring to FIGS. 1 and 2, an N-type semiconductor layer 12 is formed on the first P-type semiconductor layer 11, where the N-type semiconductor layer 12 includes a GaN-based material, and an upper surface 12a of the N-type semiconductor layer 12 is an N surface.

The GaN-based material of the N-type semiconductor layer 12 may also include at least one of GaN, AlGaN, InGaN or AlInGaN. The materials of the N-type semiconductor layer 12 and the first P-type semiconductor layer 11 may be same or different.

The material of the N-type semiconductor layer 12, for example, GaN, may be grown based on MOCVD technology. Illustratively, $NH_3$ and TMGa are an N source and a Ga source respectively and $H_2$ is a carrier gas. N-type doped ions may include at least one of silicon, germanium or oxygen.

In an optional solution, the upper surface 12a of the N-type semiconductor layer 12 may be controlled to be an N surface by directly bonding a Ga surface of the N-type semiconductor layer 12 with the Ga surface of the first P-type semiconductor layer 11.

In an optional solution, an epitaxial layer of the N-type semiconductor layer 12 for bonding may be prepared by the following method including: disposing a sacrificial layer in a process of preparing a GaN-based material epitaxial layer with an upper surface as a Ga surface, and then continuing preparing a GaN-based material epitaxial layer of a predetermined thickness with an upper surface as a Ga surface on the sacrificial layer. The sacrificial layer may include, for example, porous GaN, or H-injected GaN and the like. After preparation, the GaN-based material epitaxial layer with the upper surface as a Ga surface above the sacrificial layer may be peeled off the sacrificial layer through a process such as annealing, and a surface of the peeled GaN-based material epitaxial layer with the upper surface as a Ga surface, which is in contact with the sacrificial layer, is an N surface.

In an optional solution, the upper surface 12a of the N-type semiconductor layer 12 may be controlled to be an N surface by enabling the N surface of the N-type semiconductor layer 12 to face upward through polarity inversion in a process of forming the N-type semiconductor layer 12.

The polarity inversion includes firstly growing the N-type semiconductor layer 12 with the upper surface 12a as a Ga surface epitaxially; and next, adding a polarity inversion element during epitaxial growth to make the N surface upward, where the polarity inversion element includes, for example, Mg.

Furthermore, the polarity inversion may also include: first preparing a polarity inversion layer on the first P-type semiconductor layer 11 by using a material, for example, $Al_2O_3$; and next, continuing growing the GaN-based material on the polarity inversion layer to make the N surface upward.

Next, at step S3, still referring to FIGS. 1 and 2, a second P-type semiconductor layer 13 is formed on the N-type semiconductor layer 12, where the second P-type semiconductor layer 13 includes a GaN-based material and an upper surface 13a of the second P-type semiconductor layer 13 is an N surface.

The GaN-based material of the second P-type semiconductor layer 13 may be referred to the GaN-based material of the first P-type semiconductor layer 11. Both materials may be same or different.

In an optional solution, the upper surface 13a of the second P-type semiconductor layer 13 may be controlled to be an N surface by directly bonding a Ga surface of the second P-type semiconductor layer 13 with an N surface of the N-type semiconductor layer 12.

In an optional solution, an epitaxial layer of the second P-type semiconductor layer 13 for bonding may be prepared by the following method: disposing a sacrificial layer in a process of preparing a GaN-based material epitaxial layer with an upper surface as a Ga surface, and then continuing preparing a GaN-based material epitaxial layer of a predetermined thickness with an upper surface as a Ga surface on the sacrificial layer. The sacrificial layer may be, for example, porous GaN, and H-injected GaN and the like. After preparation, the GaN-based material epitaxial layer with the upper surface as a Ga surface above the sacrificial layer may be peeled off the sacrificial layer through a process such as annealing, and a surface of the peeled GaN-based material epitaxial layer with the upper surface as a Ga surface, which is in contact with the sacrificial layer, is an N surface.

In an optional solution, the upper surface 13a of the second P-type semiconductor layer 13 may be controlled to be an N surface by enabling the N surface of the second P-type semiconductor layer 13 to face upward through polarity inversion in a process of forming the second P-type semiconductor layer 13.

The polarity inversion refers to firstly growing the second P-type semiconductor layer 13 with the upper surface 13a as a Ga surface epitaxially; next, adding a polarity inversion element during epitaxial growth to make the N surface face upward, where the polarity inversion element is, for example, Mg and the like.

Furthermore, the polarity inversion may also refer to: first preparing a polarity inversion layer on the N-type semiconductor layer 12 by using a material, for example, $Al_2O_3$; next, continuing growing the GaN-based material on the polarity inversion layer to make the N surface face upward.

Next, at step S4, still referring to FIGS. 1 and 2, the second P-type semiconductor layer 13 and the N-type semiconductor layer 12 in a collector electrode region 1a are removed by wet etching to expose the first P-type semiconductor layer 11.

A wet etching solution, for example, a KOH solution, is corrosive on the N surface but non-corrosive on the Ga surface. The upper surfaces of the second P-type semiconductor layer 13 and the N-type semiconductor layer 12 both are N surfaces and the upper surface 11a of the first P-type semiconductor layer 11 is a Ga surface. Therefore, an etching process will automatically stop on the upper surface 11a of the first P-type semiconductor layer 11 without over-etching the first P-type semiconductor layer 11.

In the prior art, patterning is generally performed on the second P-type semiconductor layer 13 and the N-type semiconductor layer 12 through dry etching. When the dry etching stops, the first P-type semiconductor layer 13 may be over-etched. In a dry etching process, nitrogen atoms in the GaN-based material will preferentially escape, leading to a larger number of electron carriers in the first P-type semiconductor layer 11. As a result, some of the hole carriers will be neutralized, leading to a decreased hole carrier concentration and even to surface inversion. Therefore, compared with the dry etching, the wet etching may avoid the above problems in the patterning process.

Next, at step S5, still referring to FIGS. 2 and 1, the second P-type semiconductor layer 13 in a base electrode region 1b is removed by dry etching to expose the N-type semiconductor layer 12.

The dry etching may be ICP etching and a reaction gas may be Cl2 and an auxiliary gas may be N2.

When the dry etching stops, the N-type semiconductor layer 12 may be over-etched. However, in a dry etching process, nitrogen atoms in the GaN-based material will preferentially escape, leading to a larger number of electron carriers. For the N-type semiconductor layer 12, a resistivity of its surface will be reduced, helping to reduce a contact resistance of an electrical connection structure on the N-type semiconductor layer 12.

Figure 3:
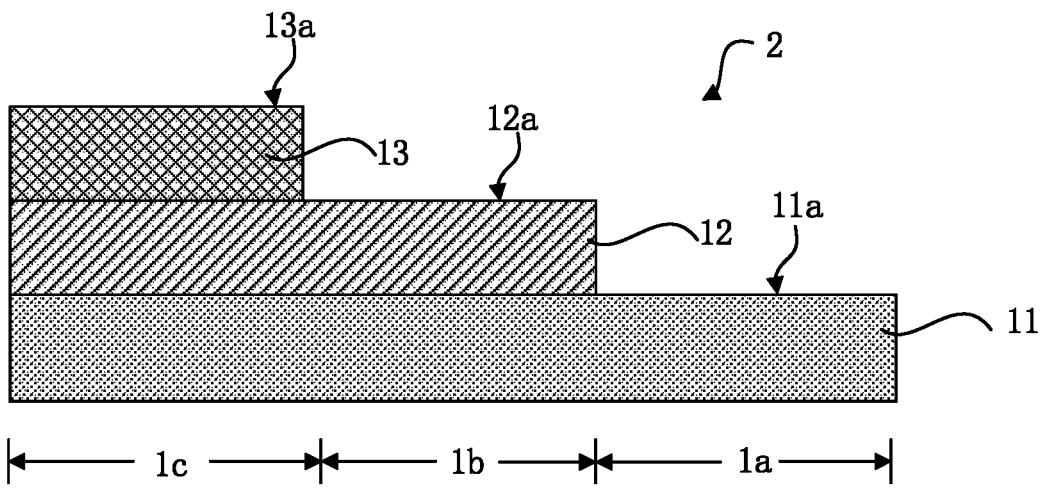
FIG. 3 is a structural schematic diagram illustrating a semiconductor structure according to a second embodiment of the present disclosure.

FIG. 3 is a structural schematic diagram illustrating a semiconductor structure according to a second embodiment of the present disclosure. With reference to FIG. 3, the semiconductor structure 2 of the second embodiment is substantially same as the semiconductor layer 1 of the first embodiment except that the semiconductor substrate 10 is omitted.

It is noted that with a Ga—N bond parallel to C axis ([0001] crystal orientation) as reference, if a Ga atom in each Ga—N bond is farther from the lower surface, the upper surface is the Ga surface.

Figure 4:
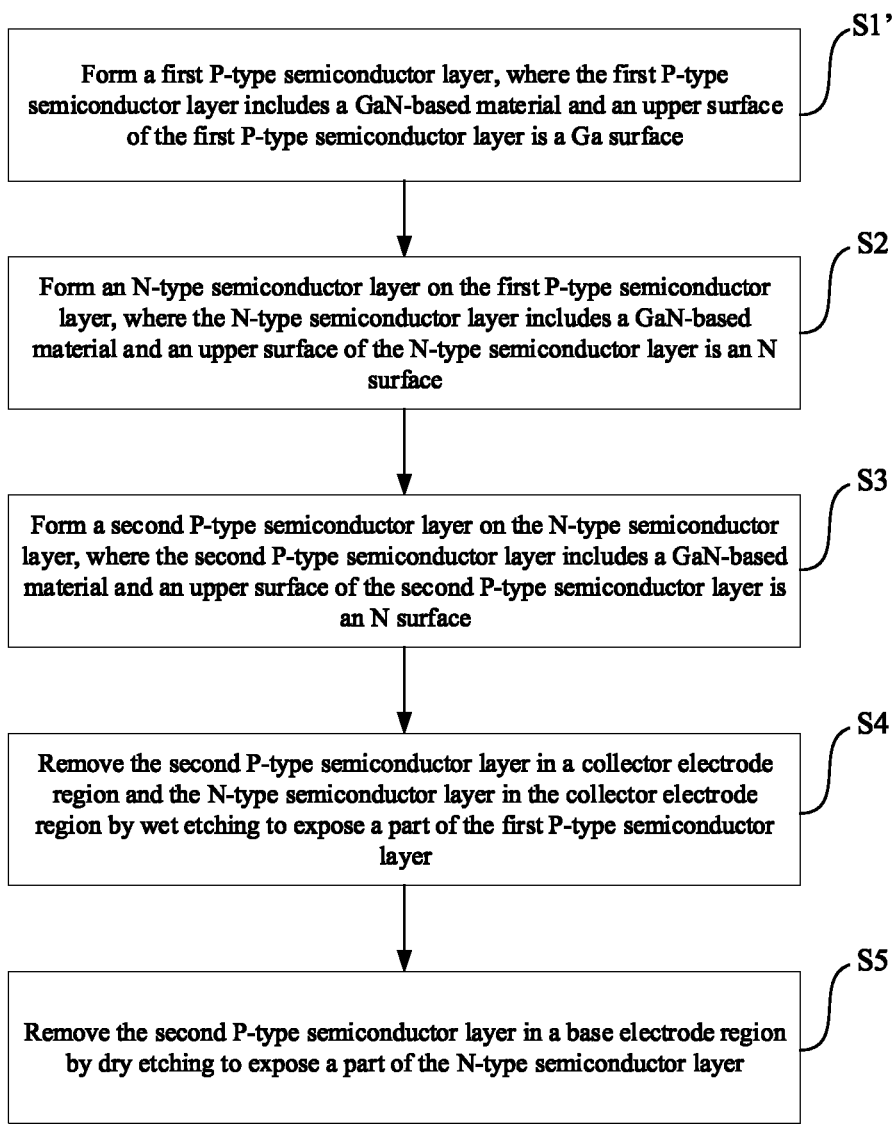
FIG. 4 is a flowchart illustrating a manufacturing method of the semiconductor structure shown in FIG. 3.

FIG. 4 is a flowchart illustrating a manufacturing method of the semiconductor structure in FIG. 3. By referring to FIG. 4, the manufacturing method of the second embodiment is substantially same as the manufacturing method of the first embodiment except for the following: at step S1', providing a first P-type semiconductor layer 11, wherein the first P-type semiconductor layer 11 includes a GaN-based material, and an upper surface 11a of the first P-type semiconductor layer 11 is a Ga surface. In other words, the first P-type semiconductor layer 11 of this embodiment may be an already-made semiconductor intermediate structure.

Figure 5:
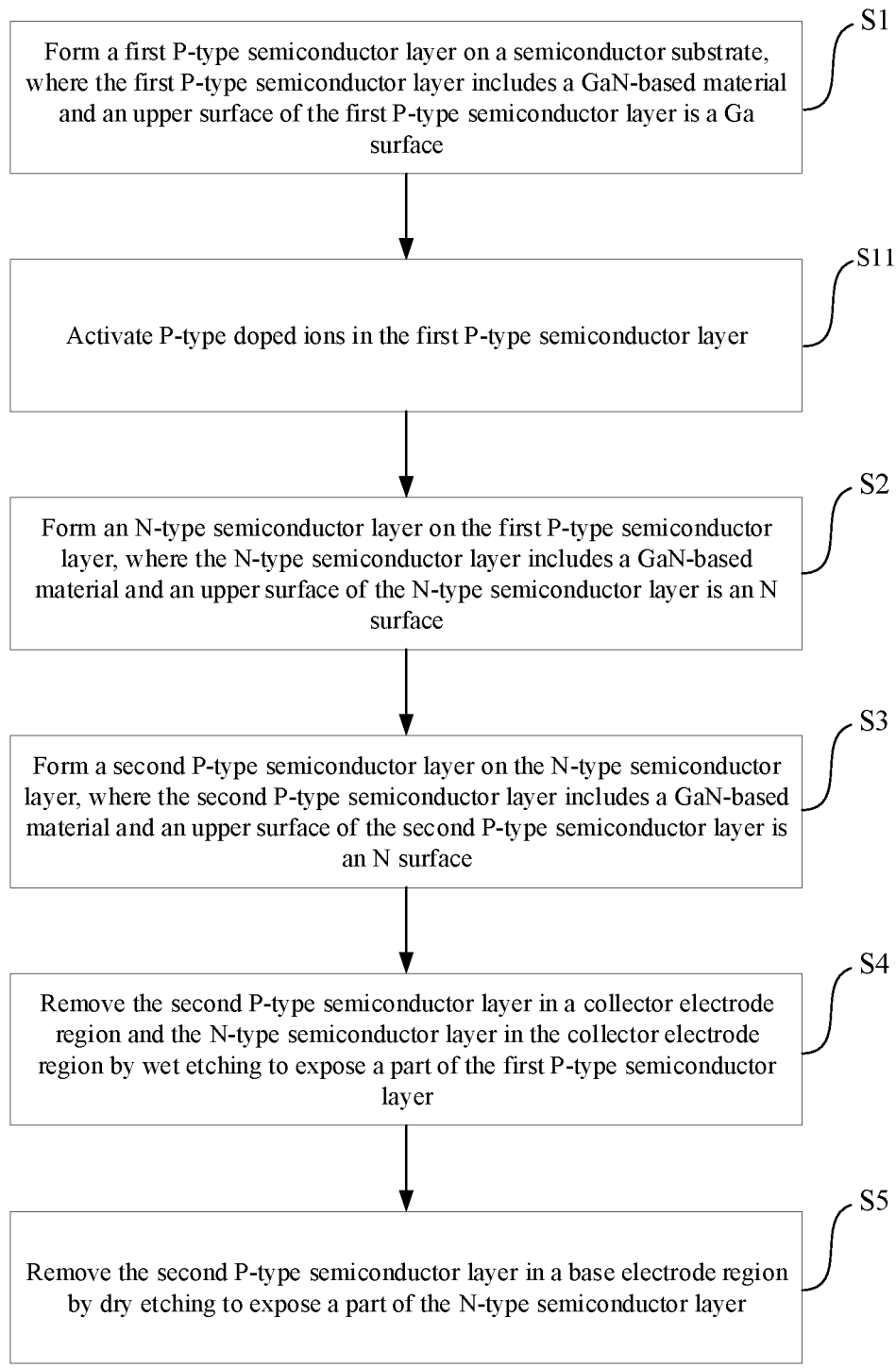
FIG. 5 is a flowchart illustrating a manufacturing method of a semiconductor structure according to a third embodiment of the present disclosure.

FIG. 5 is a flowchart illustrating a manufacturing method of a semiconductor structure according to a third embodiment of the present disclosure. By referring to FIGS. 5, 2 and 4, the manufacturing method of the third embodiment is substantially same as the manufacturing methods of the first and second embodiments, except that: step S11 is added to activate P-type doped ions in the first P-type semiconductor layer 11. The step S11 is carried out between the steps S1 and S2.

The P-type doped ion may be magnesium which may be activated by high temperature annealing. When the P-type GaN-based material is grown based on MOCVD technology, because a large number of H atoms are present in the MOCVD growth environment, if the H atoms cannot be released, the acceptor dopant Mg in GaN may easily form a covalent bond with the H atom and thus cannot produce holes, that is, may be passivated by the H atoms. In this step, because the upper surface 11a of the first P-type semiconductor layer 11 is not blocked, H atoms will be easily released and a large number of P-type doped ions Mg may form covalent bonds with the atoms in the GaN-based material, that is, activated rather than passivated.

Furthermore, a large number of Mg form covalent bonds with the atoms in the GaN-based material, which can prevent those free Mg ions from entering the N-type GaN-based material layer grown above, thereby improving the quality of the PN junction.

Figure 6:
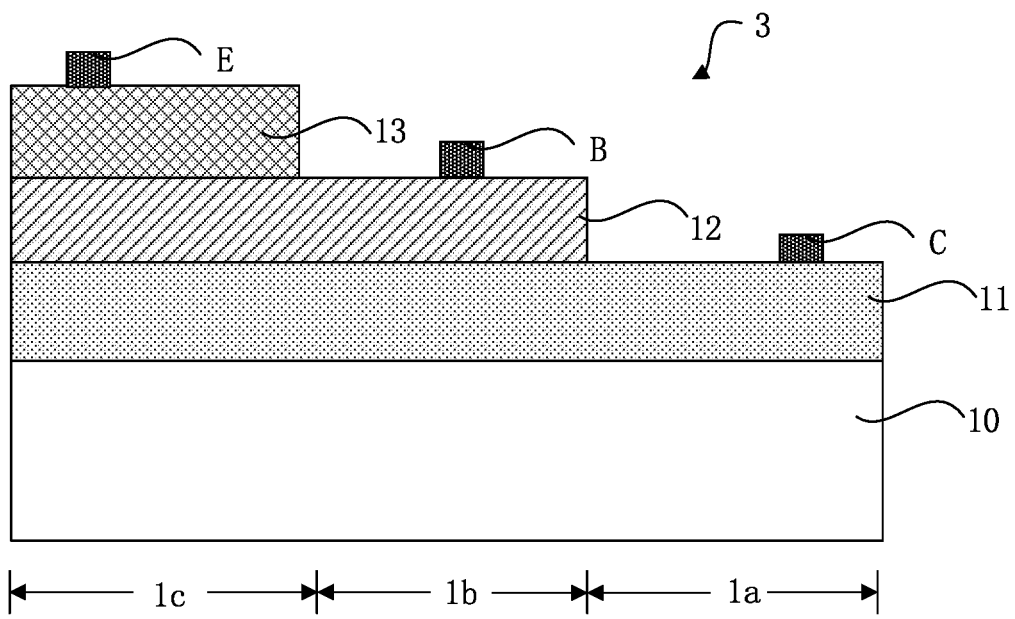
FIG. 6 is a structural schematic diagram illustrating a semiconductor structure according to a fourth embodiment of the present disclosure.

FIG. 6 is a structural schematic diagram illustrating a semiconductor structure according to a fourth embodiment of the present disclosure. The semiconductor structure 3 of the fourth embodiment is substantially same as the semiconductor structures of the first, second and third embodiments except that: the semiconductor structure 3 includes a collector electrode C on the exposed first P-type semiconductor layer 11, a base electrode B on the exposed N-type semiconductor layer 12, and an emitter electrode E on the second P-type semiconductor layer 13.

Ohmic contact is present between the collector electrode C and the first P-type semiconductor layer 11, between the base electrode B and the N-type semiconductor layer 12 and between the emitter electrode E and the second P-type semiconductor layer 13.

Materials of the collector electrode C, the base electrode B and the emitter electrode E all may be a metal or a doped semiconductor material having good conductivity.

Figure 7:
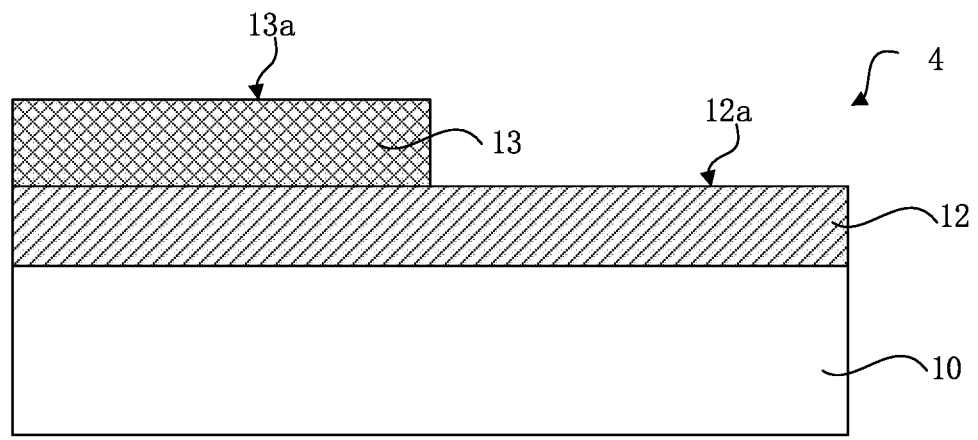
FIG. 7 is a structural schematic diagram illustrating a semiconductor structure according to a fifth embodiment of the present disclosure.

FIG. 7 is a structural schematic diagram illustrating a semiconductor structure according to a fifth embodiment of the present disclosure. The semiconductor structure 4 of the fifth embodiment is substantially same as the semiconductor structure 1 of the first embodiment, except that: the semiconductor structure 4 includes:

a semiconductor substrate 10, an N-type semiconductor layer 12 and a second P-type semiconductor layer 13 distributed from bottom to top, where:

The N-type semiconductor layer 12 includes a GaN-based material, and an upper surface 12a of the N-type semiconductor layer 12 is a Ga surface; the second P-type semiconductor layer 13 includes a GaN-based material, and an upper surface 13a of the second P-type semiconductor layer 13 is an N surface; a part of the Ga surface of the N-type semiconductor layer 12 is exposed.

It can be seen that the N-type semiconductor layer 12 and the second P-type semiconductor layer 13 in this embodiment form a PN junction.

The exposed region of the upper surface 12a of the N-type semiconductor layer 12 and the upper surface 13a of the second P-type semiconductor layer 13 form an electrical connection structure, for example, a metal interconnection structure to respectively lead out electrical signals of the N-type semiconductor layer 12 and the second P-type semiconductor layer 13.

In some embodiments, the semiconductor substrate 10 may also be omitted.

Figure 8:
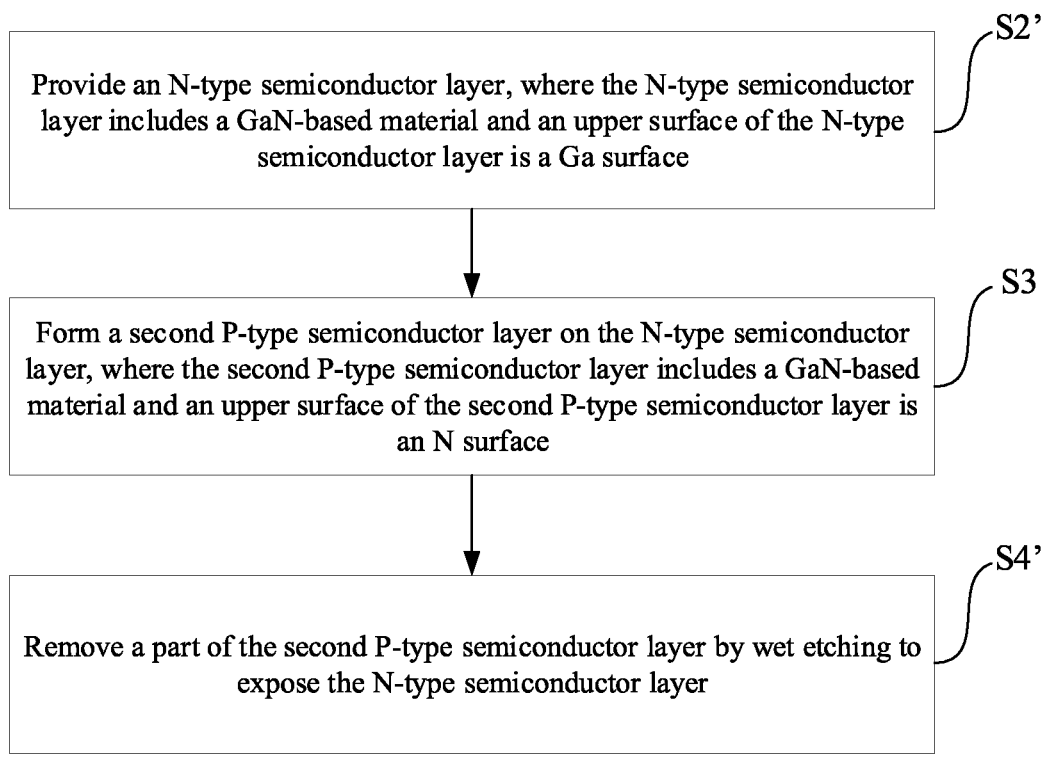
FIG. 8 is a flowchart illustrating a manufacturing method of the semiconductor structure shown in FIG. 7.

FIG. 8 is a flowchart illustrating a manufacturing method of the semiconductor structure shown in FIG. 7.

With reference to FIG. 8, the manufacturing method includes the following steps.

At step S2', an N-type semiconductor layer 12 is provided, wherein the N-type semiconductor layer 12 includes a GaN-based material and an upper surface 12a of the N-type semiconductor layer 12 is a Ga surface.

At step S3, a second P-type semiconductor layer 13 is formed on the N-type semiconductor layer 12, where the second P-type semiconductor layer 13 includes a GaN-based material and an upper surface 13a of the second P-type semiconductor layer 13 is an N surface.

At step S4', a partial region of the second P-type semiconductor layer 13 is removed by wet etching to expose the N-type semiconductor layer 12.

The above steps may be referred to the steps of the preceding embodiments and will not be repeated herein.

In this embodiment, by use of the directivity of wet etching, etching is started from the N surface of the second P-type semiconductor layer 13 and automatically stopped on the Ga surface of the N-type semiconductor layer 12, thereby avoiding over-etching.

Although the present disclosure is made as above, the present disclosure is not limited hereto. Various changes and modifications may be made by those skilled in the art without departing from the spirit and scope of the present disclosure. Therefore, the scope of the present disclosure shall be defined by the claims.

The invention claimed is:

1. A manufacturing method of a semiconductor structure, comprising:
   providing a first P-type semiconductor layer, wherein the first P-type semiconductor layer comprises a GaN-based material, and an upper surface of the first P-type semiconductor layer is a Ga surface;
   forming an N-type semiconductor layer on the first P-type semiconductor layer, wherein the N-type semiconductor layer comprises a GaN-based material, and an upper surface of the N-type semiconductor layer is an N surface;
   forming a second P-type semiconductor layer on the N-type semiconductor layer, wherein the second P-type semiconductor layer comprises a GaN-based material, and an upper surface of the second P-type semiconductor layer is an N surface;
removing the second P-type semiconductor layer in a collector electrode region and the N-type semiconductor layer in the collector electrode region by wet etching, such that etching is started from the N surface of the second P-type semiconductor layer and automatically stopped on the Ga surface of the first P-type semiconductor layer, so as to expose a part of the first P-type semiconductor layer; and
removing the second P-type semiconductor layer in a base electrode region by dry etching to expose a part of the N-type semiconductor layer.

2. The manufacturing method of claim 1, wherein before the N-type semiconductor layer is formed on the first P-type semiconductor layer, the method further comprising:
activating P-type doped ions in the first P-type semiconductor layer.

3. The manufacturing method of claim 1, further comprising:
forming a collector electrode on the first P-type semiconductor layer of the collector electrode region;
forming a base electrode on the N-type semiconductor layer of the base electrode region; and
forming an emitter electrode on the second P-type semiconductor layer of an emitter electrode region.

4. The manufacturing method of claim 1, wherein the N-type semiconductor layer with the upper surface as N surface is formed on the first P-type semiconductor layer by:
directly bonding a Ga surface of the N-type semiconductor layer with the Ga surface of the first P-type semiconductor layer.

5. The manufacturing method of claim 1, wherein the N-type semiconductor layer with the upper surface as N surface is formed on the first P-type semiconductor layer by:
enabling the N surface of the N-type semiconductor layer to face upward through polarity inversion in a process of forming the N-type semiconductor layer.

6. The manufacturing method of claim 1, wherein the second P-type semiconductor layer with the upper surface as N surface is formed on the N-type semiconductor layer by:
directly bonding a Ga surface of the second P-type semiconductor layer with the N surface of the N-type semiconductor layer.

7. The manufacturing method of claim 1, wherein the second P-type semiconductor layer with the upper surface as N surface is formed on the N-type semiconductor layer by:
enabling the N surface of the second P-type semiconductor layer to face upward through polarity inversion in a process of forming the second P-type semiconductor layer.

8. The manufacturing method of claim 1, wherein the GaN-based material comprises at least one of GaN, AlGaN, InGaN or AlInGaN.

9. A manufacturing method of a semiconductor structure, comprising:
providing an N-type semiconductor layer, wherein the N-type semiconductor layer comprises a GaN-based material, and an upper surface of the N-type semiconductor layer is a Ga surface;
forming a second P-type semiconductor layer on the N-type semiconductor layer, wherein the second P-type semiconductor layer comprises a GaN-based material, and an upper surface of the second P-type semiconductor layer is an N surface; and
removing a part of the second P-type semiconductor layer by wet etching, such that etching is started from the N surface of the second P-type semiconductor layer and automatically stopped on the Ga surface of the N-type semiconductor layer, so as to expose a part of the N-type semiconductor layer.

10. The manufacturing method of claim 9, wherein the second P-type semiconductor layer with the upper surface as N surface is formed on the N-type semiconductor layer by:
directly bonding a Ga surface of the second P-type semiconductor layer with the Ga surface of the N-type semiconductor layer.

11. The manufacturing method of claim 9, wherein the second P-type semiconductor layer with the upper surface as N surface is formed on the N-type semiconductor layer by:
enabling the N surface of the second P-type semiconductor layer to face upward through polarity inversion in a process of forming the second P-type semiconductor layer.

12. A semiconductor structure, manufactured by the manufacturing method according to claim 1, and comprising:
a first P-type semiconductor layer, an N-type semiconductor layer and a second P-type semiconductor layer distributed from bottom to top, wherein,
the first P-type semiconductor layer comprises a GaN-based material, and an upper surface of the first P-type semiconductor layer is a Ga surface;
the N-type semiconductor layer comprises a GaN-based material, and an upper surface of the N-type semiconductor layer is an N surface;
the second P-type semiconductor layer comprises a GaN-based material, and an upper surface of the second P-type semiconductor layer is an N surface; and
a part of the Ga surface of the first P-type semiconductor layer and a part of the N surface of the N-type semiconductor layer are exposed.

13. The semiconductor structure of claim 12, further comprising:
a collector electrode on the part of the first P-type semiconductor layer that is exposed,
a base electrode on the part of the N-type semiconductor layer that is exposed, and
an emitter electrode on the second P-type semiconductor layer.

14. A semiconductor structure, manufacturing manufactured by the manufacturing method according to claim 9, and comprising:
an N-type semiconductor layer and a second P-type semiconductor layer distributed from bottom to top, wherein,
the N-type semiconductor layer comprises a GaN-based material, and an upper surface of the N-type semiconductor layer is a Ga surface;
the second P-type semiconductor layer comprises a GaN-based material, and an upper surface of the second P-type semiconductor layer is an N surface; and
a part of the Ga surface of the N-type semiconductor layer is exposed.

15. The semiconductor structure of claim 14, wherein the N-type semiconductor layer and the second P-type semiconductor layer form a PN junction.

16. The semiconductor structure of claim 12, wherein the GaN-based material comprises at least one of GaN, AlGaN, InGaN or AlInGaN.

17. The semiconductor structure of claim 12, wherein the N-type semiconductor layer and the second P-type semiconductor layer form a PN junction.

18. The manufacturing method of claim 1, wherein the N-type semiconductor layer and the second P-type semiconductor layer form a PN junction.

19. The manufacturing method of claim 9, wherein the N-type semiconductor layer and the second P-type semiconductor layer form a PN junction.

20. The manufacturing method of claim 9, wherein the GaN-based material comprises at least one of GaN, AlGaN, InGaN or AlInGaN.

\* \* \* \* \*